(12) United States Patent
Sugie

(10) Patent No.: US 8,982,497 B2
(45) Date of Patent: Mar. 17, 2015

(54) CLASS-AB AMPLIFIER, MOTOR DRIVE DEVICE, MAGNETIC DISK STORAGE DEVICE, AND ELECTRONIC APPARATUS

(71) Applicant: Rohm Co., Ltd, Kyoto (JP)

(72) Inventor: Hisashi Sugie, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 13/918,213

(22) Filed: Jun. 14, 2013

(65) Prior Publication Data
US 2014/0368949 A1 Dec. 18, 2014

(51) Int. Cl.
G11B 5/02 (2006.01)
H03F 3/213 (2006.01)
H03F 1/32 (2006.01)
H02P 25/02 (2006.01)
G11B 19/20 (2006.01)
H02P 7/00 (2006.01)

(52) U.S. Cl.
CPC .............. *H03F 3/213* (2013.01); *H03F 1/3205* (2013.01); *H02P 25/028* (2013.01); *G11B 19/2009* (2013.01); *H02P 2007/0083* (2013.01)
USPC .......................................................... 360/67

(58) Field of Classification Search
None
See application file for complete search history.

(56) References Cited

U.S. PATENT DOCUMENTS

| 6,374,043 | B1 | 4/2002 | El-Sherif et al. | |
| 7,280,308 | B2 * | 10/2007 | Kokami | 360/78.04 |
| 7,535,305 | B1 * | 5/2009 | Li et al. | 330/298 |
| 7,642,819 | B1 * | 1/2010 | Escobar-Bowser et al. | 327/110 |
| 7,764,122 | B1 * | 7/2010 | Dasgupta | 330/255 |
| 7,848,044 | B2 * | 12/2010 | Kokami et al. | 360/67 |
| 8,144,420 | B1 * | 3/2012 | Li et al. | 360/75 |

* cited by examiner

*Primary Examiner* — K. Wong
(74) *Attorney, Agent, or Firm* — Cantor Colburn LLP

(57) ABSTRACT

A class-AB amplifier has upper side and lower side transistors, a linear driver, upper side and lower side idlers, upper side and lower side detection current generators, and an off driver. The upper side and lower side idlers bias upper side and lower side gate voltages by generating upper side and lower side bias currents so as to turn on the upper side and the lower side transistors at the same time in the crossover region between an input voltage and a reference voltage respectively. The upper side detection current generator and the lower side detection current generator generates upper side and lower side detection currents in accordance with upper side and lower side bias currents respectively. The off driver controls the lower side gate voltage so as to reduce a degree of conduction of the lower side transistor as the upper side detection current is larger, and controls the upper side gate voltage so as to reduce a degree of conduction of the upper side transistor as the lower side detection current is larger.

15 Claims, 11 Drawing Sheets

US 8,982,497 B2

CLASS-AB AMPLIFIER, MOTOR DRIVE DEVICE, MAGNETIC DISK STORAGE DEVICE, AND ELECTRONIC APPARATUS

BACKGROUND OF THE INVENTION

1. Field of the Invention

The invention described in this specification relates to a class-AB amplifier.

2. Description of Related Art

As examples of a technology related to a motor drive device, there is U.S. Pat. No. 6,374,043 B1 specification.

However, a conventional class-AB amplifier has a problem that a large flow-through current flows into an output stage when a voltage level of an input signal varies suddenly. Besides, an idling current always flows into the output stage to reduce crossover distortion (zero-cross distortion) in the conventional class-AB amplifier, and therefore, the conventional class-AB amplifier leaves room for improvement as to power consumption.

SUMMARY OF THE INVENTION

In light of the above problem found by the applicant, it is an object of the present invention to provide a class-AB amplifier that is able to prevent a flow-through current and reduce power consumption.

A class-AB amplifier according to the present invention has an upper side transistor which is connected between an application terminal of a first power supply voltage and an application terminal of an output voltage, a lower side transistor which is connected between an application terminal of a second power supply voltage and the application terminal of the output voltage, a linear driver which generates an upper side gate voltage and a lower side gate voltage varying continuously with reverse polarity in accordance with an input voltage and a reference voltage to output the upper side gate voltage and the lower side gate voltage to the upper side transistor and the lower side transistor, an upper side idler which biases the upper side gate voltage by applying an upper side bias current between an application terminal of the upper side gate voltage and the application terminal of the output voltage so as to turn on the upper side transistor in a crossover region between the input voltage and the reference voltage, a lower side idler which biases the lower side gate voltage by applying a lower side bias current between an application terminal of the lower side gate voltage and the application terminal of the second power supply voltage so as to turn on the lower side transistor in the crossover region, an upper side detection current generator which generates an upper side detection current in accordance with the upper side bias current, a lower side detection current generator which generates a lower side detection current in accordance with the lower side bias current, and an off driver which controls the lower side gate voltage so as to reduce a degree of conduction of the lower side transistor as the upper side detection current is larger, and controls the upper side gate voltage so as to reduce a degree of conduction of the upper side transistor as the lower side detection current is larger.

Here, as to the invention described in present specification, other features, elements, steps, advantages and characteristics of the present invention will become more apparent from the following detailed description of preferred embodiments of the present invention and the attached drawings.

DETAILED DESCRIPTION OF PREFERRED EMBODIMENTS

<Motor Drive Device>

Figure 1:
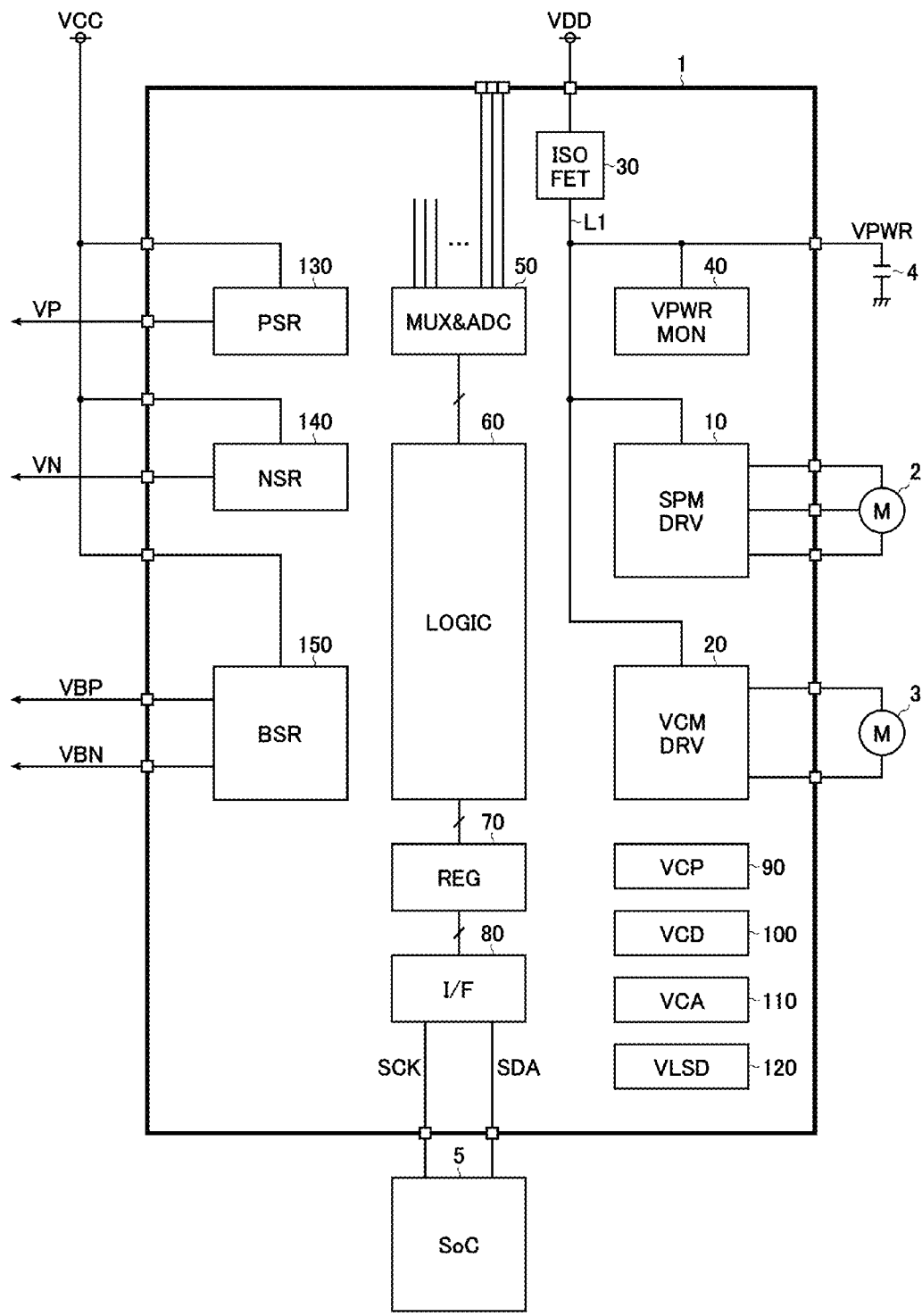
FIG. 1 is a block diagram showing a structural example of a motor drive device.

FIG. 1 is a block diagram showing a structural example of a motor drive device. The motor drive device 1 of this structural example is a monolithic semiconductor integrated circuit device (i.e., a system motor driver LSI) which performs drive control of a spindle motor 2 and a voice coil motor 3 used in a hard disk drive: has a spindle motor driver 10; a voice coil motor driver 20; an insulation switch 30; a power voltage monitor 40; A/D converter 50; a logic unit 60; a register 70; a serial interface 80; a charge pump 90; internal regulators 100 to 120, a step-down switching regulator 130; an inverting switching regulator 140; and a step-up switching regulator 150.

Besides, the motor drive device 1 has various kinds of sensor detection circuits to monitor an output of an external sensor (a shock sensor, a pressure sensor, a temperature sensor, and so on) except the above-mentioned structural elements. Here, the whole structure of the hard disk drive that incorporates the motor drive device 1 are illustrated below in detail.

A power supply voltage VDD (e.g., 12V) is applied from a host of an external device to a power supply line L1 of a motor drive system as a power voltage VPWR for driving the spindle motor 10 and the voice coil motor driver 20. Here, a capacitor 4 for smoothing the power voltage VPWR is provided in the form of an external component to the power supply line L1.

The spindle motor driver 10 is connected to the power supply line L1, and rotates a platter (a magnetic disk) at predetermined rotation speeds by rotating the spindle motor 2 (e.g., a 3-phase brushless DC motor in the present structural example) with the power supply voltage VDD when the power supply voltage VDD is normal. On the other hand, the spindle motor driver 10 rectifies phase voltages, one for each phase, generated during idling of the spindle motor 2, and regenerates rectified phase voltages to the power supply line L1 as the power voltage VPWR when the power supply voltage VDD is abnormal (e.g., power supply interruptions, instantaneous power failure, and so on). The power voltage VPWR is provided for relevant parts (e.g., the voice coil motor 20 etc.) of the motor drive device 1 via the power supply line L1.

The voice coil motor driver 20 is connected to the power supply line L1, and moves a magnetic head on the platter in a tracking mode by driving the voice coil motor 3 with the power supply voltage VDD when the power supply voltage VDD is normal. On the other hand, the voice coil motor driver 20 drives the voice coil motor 20 with the power voltage VPWR regenerating from the spindle motor driver 10 to the power supply line L1 when the power supply voltage VDD is abnormal. Thus, it is possible to operate the magnetic head automatically to an outside lamp mechanism further than an outermost circumference of the platter. A collision between the magnetic head and the platter is avoidable in advance by possessing such a power off retraction function when the power supply voltage VDD is abnormal.

The insulation switch 30 is a backflow prevention element which connects and disconnects a power supply pin (an external terminal to apply the power supply voltage VDD) of the motor driver 1 to and from the power supply line L1. The insulation switch 30 turns on when the power supply voltage VDD is normal, and turns off when the power supply voltage VDD is abnormal. A MOS [metal oxide semiconductor] field effect transistor, a diode and the like are preferably usable as the insulation switch 30.

The power voltage monitor 40 monitors the power voltage VPWR applied to the power supply line L1 to decide that the power voltage VPWR is normal or abnormal (consequently, to decide that the power supply voltage VDD is normal or abnormal). The decision of the power voltage monitor 40 is used for ON/OFF control of the insulation switch 30, operation mode switch control (switch control of normal mode/rectified regeneration mode) of the spindle motor driver 10, etc.

The A/D converter 50 converts a plurality of analog signals inputted from the inside and the outside of devices into digital signals to output the digital signals to the logic unit 60.

The logic unit 60 controls entire operation of the motor drive device 1 based on various digital signals inputted from the A/D converter 50, various register data read from the register 70, and so on.

The register 70 stores the various register data written from a microcomputer 5 (SoC [system-on chip]) and the logic unit 60 in a volatile manner.

The serial interface 80 performs, for example, serial communication with the microcomputer 5 (a main element controlling entire operation of a hard disk drive) located to the outside of the motor drive device 1 based on a SPI [serial peripheral interface] standard.

The charge pump 90 generates a step-up voltage VCP (e.g., VPWR+5V) by raising the power voltage VPWR in charge pump operation.

The internal regulator 100 generates an internal power supply voltage VCD (e.g., 1.5V) for a digital system by stepping down the power supply voltage VDD (e.g., 12V) or a power supply voltage VCC (e.g., 5V).

The internal regulator 110 generates an internal power supply voltage VCA (e.g., 1.5V) for an analog system by stepping down the power supply voltage VDD or the power supply voltage VCC.

The internal regulator 120 generates an internal power supply voltage VLSD (e.g., 5V) for driving a low side gate by stepping down the step-up voltage VCP.

The step-down switching regulator 130 generates a positive voltage VP (e.g., 0.9V, 1.8V, 2.5V, or 3.3V) by stepping down the power supply voltage VCC. The positive voltage VP is used as a positive power supply voltage (e.g., a power supply voltage for a core of the microcomputer 5 or a power supply voltage for a memory) of each part of the hard disk drive.

The inverting switching regulator 140 generates a negative voltage VN (e.g., −5V) by inverting the power supply voltage VCC. The negative voltage VN is used as a negative voltage (e.g., a negative power supply voltage for a head amplifier) of each part of the hard disk drive.

The step-up switching regulator 150 generates a positive step-up voltage VBP and a negative step-up voltage VBN (e.g., ±17V) by stepping up the power supply voltage VCC to a positive direction and a negative direction. The positive step-up voltage VBP and the negative step-up voltage VBN are respectively used as a positive and negative power supply voltage (e.g., a positive and negative power supply voltage for a piezoelectric actuator built into the magnetic head) of each part of the hard disk drive.

<Voice Coil Motor>

Figure 2:
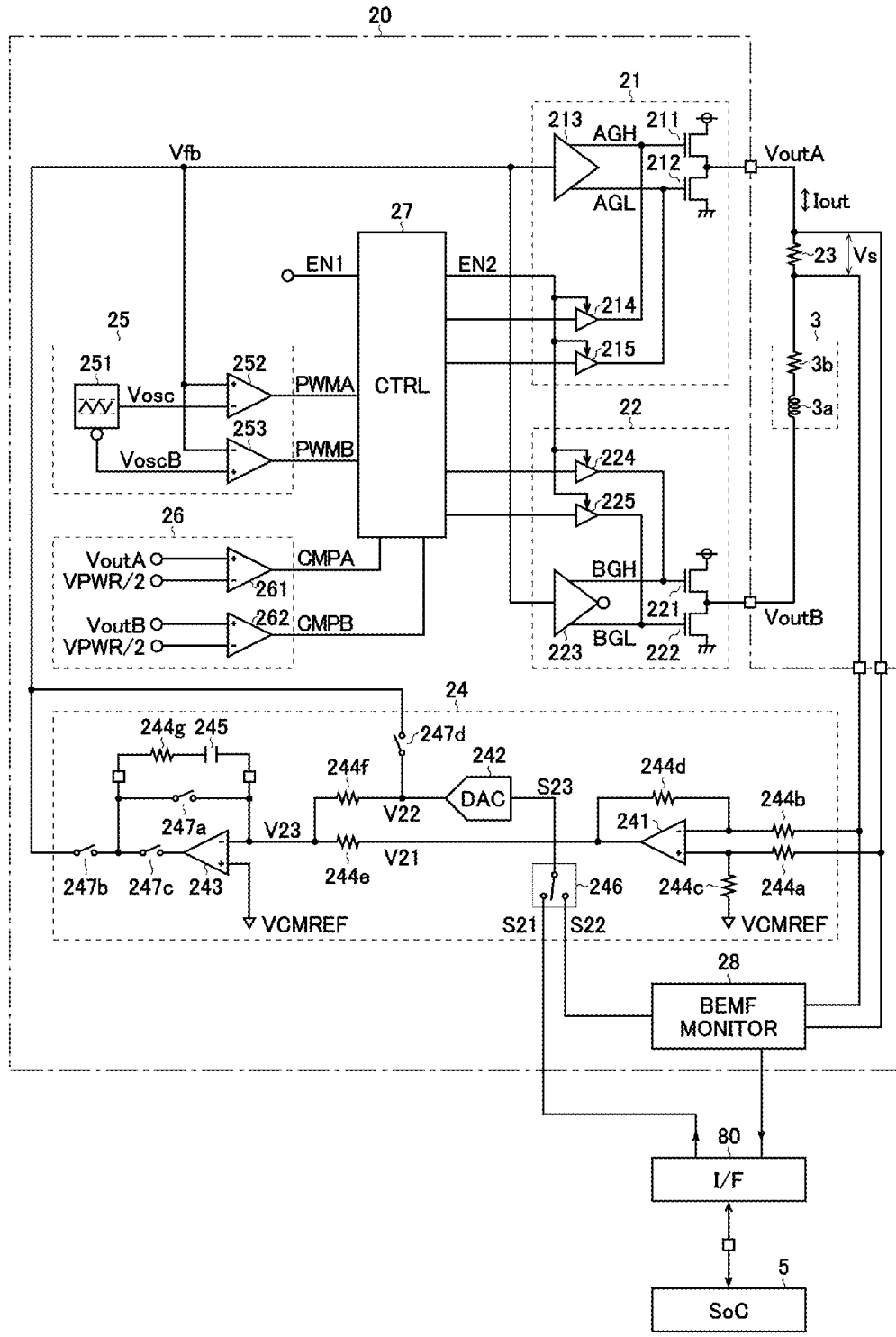
FIG. 2 is a circuit diagram showing a structural example of a voice coil motor driver 20.

FIG. 2 is a circuit diagram showing a structural example of a voice coil motor driver 20. The voice coil motor driver 20 in the present structural example includes driver circuits 21 and 22, a sense resistor 23, an output feedback circuit 24, a PWM [pulse width modulation] signal generation circuit 25, an output voltage monitoring circuit 26, control circuit 27, and a back electromotive force monitoring circuit 28 to generate an output current Iout flowing into the voice coil motor 3.

The voice coil motor 3 is one of objects for drive of the motor drive device 1, and is driven by supplying the output current Iout for a coil 3a. Here, a resistance component 3b accompanies the coil 3a of the voice coil motor 3 in series.

The driver circuit 21 generates the output current Iout to the voice coil motor 3 with the driver circuit 22. The driver 21 circuit includes output transistors 211 and 212, a linear driver 213, and pre-drivers 214 and 215.

The output transistor 211 is an upper side switch element (NMOSFET [N-channel type metal oxide semiconductor field effect transistor]) which connects and disconnects a first terminal of the voice coil motor 3 to and from an application terminal of a power voltage VPWR (power supply voltage VDD). A drain of the output transistor 211 is connected to the application terminal of the power voltage VPWR. A source of the output transistor 211 is connected to an application terminal of an output voltage VoutA (the first terminal of the voice coil motor 3). A gate of the output transistor 211 is connected to an application terminal of a gate voltage AGH. Here, the output transistor 211 can use a PMOSFET instead of the NMOSFET.

The output transistor 212 is a lower side switch element (NMOSFET) which connects and disconnects the first terminal of the voice coil motor 3 to and from an application terminal of a ground voltage GND. A drain of the output transistor 212 is connected to the application terminal of the output voltage VoutA. A source of the output transistor 212 is connected to the application terminal of the ground voltage GND. A gate of the output transistor 212 is connected to an application terminal of a gate voltage AGL.

The linear driver 213 continuously varies the gate voltages AGH and AGL based on a feedback voltage Vfb. More specifically, the linear driver 213 makes the gate voltage AGH higher and makes the gate voltage AGL lower as the feedback voltage Vfb is higher than a reference voltage VCMREF. To the contrary, the linear driver 213 makes the gate voltage AGH lower and makes the gate voltage AGL higher as the feedback voltage Vfb is lower than the reference voltage VCMREF. Here, a class-AB power amplifier is preferably usable to an output stage of the linear driver 213.

The pre-driver 214 periodically switches the gate voltage AGH of the output transistor 211 to a high level (VoutA+ Vreg) or a low level (VoutA) based on indication of the control circuit 27 so as to perform PWM drive of the output transistor 211 when an internal enabling signal EN2 is a logical level on enabling a PWM (e.g., a high level). On the other hand, the pre-driver 214 becomes a high impedance state without depending on the indication of the control circuit 27 and is separated from the gate of the output transistor 211 so as not to prevent linear drive of the output transistor 211 when the internal enabling signal EN2 is a logical level on disabling the PWM (e.g., a low level).

The pre-driver 215 periodically switches the gate voltage AGL of the output transistor 212 to a high level (Vreg) or a low level (GND) based on the indication of the control circuit 27 so as to perform PWM drive of the output transistor 212 when the internal enabling signal EN2 is a logical level on enabling the PWM (e.g., a high level). On the other hand, the pre-driver 215 becomes a high impedance state without depending on the indication of the control circuit 27 and is separated from the gate of the output transistor 212 so as not to prevent the linear drive of the output transistor 212 when the internal enabling signal EN2 is a logical level on disabling the PWM (e.g., a low level).

The driver circuit 22 generates the output current Iout to the voice coil motor 3 with the driver circuit 21. The driver 22 circuit includes output transistors 221 and 222, a linear driver 223, and pre-drivers 224 and 225.

The output transistor 221 is an upper side switch element (NMOSFET) which connects and disconnects a second terminal of the voice coil motor 3 to and from the application terminal of the power voltage VPWR. A drain of the output transistor 221 is connected to the application terminal of the power voltage VPWR. A source of the output transistor 221 is connected to an application terminal of an output voltage VoutB (the second terminal of the voice coil motor 3). A gate of the output transistor 221 is connected to an application terminal of a gate voltage BGH. Here, the output transistor 221 can use a PMOSFET instead of the NMOSFET.

The output transistor 222 is a lower side switch element (NMOSFET) which connects and disconnects the second terminal of the voice coil motor 3 to and from the application terminal of the ground voltage GND. A drain of the output transistor 222 is connected to the application terminal of the output voltage VoutB. A source of the output transistor 222 is connected to the application terminal of the ground voltage GND. A gate of the output transistor 222 is connected to an application terminal of a gate voltage BGL.

The linear driver 223 continuously varies the gate voltages BGH and BGL based on the feedback voltage Vfb. However, the linear driver 223 has reverse output polarity to the linear driver 213. More specifically, the linear driver 223 makes the gate voltage BGH lower and makes the gate voltage BGL higher as the feedback voltage Vfb is higher than the reference voltage VCMREF. To the contrary, the linear driver 223 makes the gate voltage BGH higher and makes the gate voltage AGL lower as the feedback voltage Vfb is lower than the reference voltage VCMREF. Here, a class-AB power amplifier is preferably usable to an output stage of the linear driver 223.

The pre-driver 224 periodically switches the gate voltage BGH of the output transistor 221 to a high level (VoutB+Vreg) or a low level (VoutB) based on the indication of the control circuit 27 so as to perform PWM drive of the output transistor 221 when the internal enabling signal EN2 is a logical level on enabling the PWM (e.g., a high level). On the other hand, the pre-driver 224 becomes a high impedance state without depending on the indication of the control circuit 27 and is separated from the gate of the output transistor 221 so as not to prevent linear drive of the output transistor 221 when the internal enabling signal EN2 is a logical level on disabling the PWM (e.g., a low level).

The pre-driver 225 periodically switches the gate voltage BGL of the output transistor 222 to a high level (Vreg) or a low level (GND) based on indication of the control circuit 27 so as to perform PWM drive of the output transistor 222 when the internal enabling signal EN2 is a logical level on enabling the PWM (e.g., a high level). On the other hand, the pre-driver 225 becomes a high impedance state without depending on the indication of the control circuit 27 and is separated from the gate of the output transistor 222 so as not to prevent the linear drive of the output transistor 222 when the internal enabling signal EN2 is a logical level on disabling the PWM (e.g., a low level).

The sense resistor 23 (resistance value: Rs) is connected to the voice coil motor 3 in series, and generates a voltage Vs (=Iout*Rs) across both terminals of the sense resistor 23 in accordance with the output current Iout.

The output feedback circuit 24 monitors the voltage Vs (corresponding to a detection result of the output current Iout) across both terminals of the sense resistor 23 to generate the feedback voltage Vfb. As described above, it is possible to accurately control an extremely small output current Iout because the voice coil motor driver 20 in the present structural example has the output feedback circuit 24 for a current mode to perform feedback control of the output current Iout. Here, the output feedback circuit 24 includes an operational amplifier 241, a D/A converter 242, an error amplifier 243, resistors 244a to 244g, a capacitor 245, a selector 246, and switches 247a to 247d.

A non-inverting input terminal (+) of the operational amplifier 241 is connected to a first terminal of the sense resistor 23 (a connection node between the first terminal of the sense resistor 23 and the driver circuit 21) via the resistor 244a. An inverting input terminal (−) of the operational amplifier 241 is connected to a second terminal of the sense resistor 23 (a connection node between the second terminal of the sense resistor 23 and the voice coil motor 3) via the resistor 244b. The resistor 244c is connected between the non-inverting input terminal (+) of the operational amplifier 241 and an application terminal of the reference voltage VCMREF. The resistor 244d is connected between the inverting input terminal (−) and an output terminal of the operational amplifier 241. The output terminal of the operational amplifier 241 is connected to an inverting input terminal (−) of the error amplifier 243 via the resistor 244e (resistor value: Rf). A first input terminal of the selector 246 is connected to an application terminal of a first motor control signal S21 (e.g., 15-bit digital signal) inputted via the serial interface 80 from the microcomputer 5. A second input terminal of the selector 246 is connected to an application terminal of a second motor control signal S22 (e.g., 15-bit digital signal) inputted from the back electromotive force monitoring circuit 28. An input terminal of the D/A converter 242 is connected to an output terminal of the selector 246 (an application terminal of a third motor control signal 823). An output terminal of the D/A converter 242 is connected to the inverting input terminal (−) of the error amplifier 243 via the resistor 244f (resistor value: Ri). A non-inverting input terminal (+) of the error amplifier 243 is connected to the application terminal of the reference voltage VCMREF. The resistor 244g and the capacitor 245 are connected in series between the inverting input terminal (−) and an output terminal of the error amplifier 243.

A first terminal of the switch 247a is connected to the inverting input terminal (−) of the error amplifier 243. A second terminal of the switch 247a is connected to each of first terminals of the switch 247b and 247c. A second terminal of the switch 247b is connected to an application terminal of the feedback voltage Vfb. A second terminal of the switch 247c is connected to the output terminal of the error amplifier 243. A first terminal of the switch 247d is connected to the output terminal of the D/A converter 242. A second terminal of the switch 247d is connected to the application terminal of the feedback voltage Vfb. Here, switching control of the switches 247a to 247d is described in detail later.

In the output feedback circuit 24 having the above structure, the operational amplifier 241 forms a differential amplifier with resistors 244a to 244d to generate a voltage V21 by amplifying the voltage Vs across both terminals of the sense resistor 23. The voltage V21 becomes a voltage signal which varies on a basis of the reference voltage VCMREF.

The D/A converter 242 generates a voltage V22 based on the third motor control signal S23 (e.g., 15-bit digital signal) outputted from the selector 246.

The error amplifier 243 amplifies a difference between a voltage V23 (=(Ri*V21+Rf*V22)/(Rf+Ri)) based on both the voltage V21 and the voltage V22 and the predetermined reference voltage VCMREF to generate the feedback voltage Vfb. If the output current Iout flows from the driver circuit 21 into the driver circuit 22 via the voice coil motor 3, the feedback voltage Vfbn varies in the range of the voltage higher than the reference voltage VCMREF. To the contrary, if the output current Iout flows from the driver circuit 22 into the driver circuit 21 via the voice coil motor 3, the feedback voltage Vfb varies in the range of the voltage lower than the reference voltage VCMREF.

The PWM signal generation circuit 25 compares the feedback voltage Vfb with a slope voltage Vosc and an inverting slope voltage VoscB respectively to generate a PWM signal PWMA and a PWM signal PWMB. The PWM signal generation circuit 25 includes an oscillator 251 and comparators 252 and 253.

The oscillator 251 generates a slope voltage Vosc having a triangle waveform or a sawtooth waveform of a predetermined frequency and an inverting slope voltage VoscB which inverts the slope voltage Vosc.

The comparator 252 compares the feedback voltage Vfb applied to a non-inverting input terminal (+) thereof with the slope voltage Vosc applied to an inverting input terminal (−) thereof to generate the PWM signal PWMA.

The comparator 253 compares the feedback voltage Vfb applied to an inverting input terminal (−) thereof with the inverting slope voltage VoscB applied to a non-inverting input terminal (+) thereof to generate the PWM signal PWMB.

The output voltage monitoring circuit 26 monitors the output voltages VoutA and VoutB applied to the voice coil motor 3. The output voltage monitoring circuit 26 includes comparators 261 and 262.

The comparator 261 compares the output voltage VoutA applied to a non-inverting input terminal (+) thereof with a threshold voltage Vth (=VPWR/2) applied to an inverting input terminal (−) thereof to generate a comparison signal CMPA.

The comparator 262 compares the output voltage VoutB applied to a non-inverting input terminal (+) thereof with the threshold voltage Vth (=VPWR/2) applied to an inverting input terminal (−) thereof to generate a comparison signal CMPB.

The control circuit 27 receives an external enabling signal EN1, the PWM signals PWMA and PWMB, and the comparison signals CMPA and CMPB as input signals to perform drive control (including the generation of the internal enabling signal EN2) of the driver circuits 21 and 22. In particular, when the driver circuits 21 and 22 are switched from a PWM drive state to a linear drive state, the control circuit 27 controls the switching timing so as not to change a path into which the output current Iout flows before and after the switch thereof, and controls the pre-drivers (214, 215, 224, and 225) so as to switch the drive circuits 21 and 22 to a high impedance state once on the way of the switch thereof. According to the above-mentioned control, it is possible to perform the switch of the motor drive system smoothly without a glitch of the output current Iout or a flow-through current (consequently, unnecessary energy loss) to an output stage of the power amplifier.

The back electromotive force monitoring circuit 28 monitors a BEMF [back electromotive force] generated by the voice coil motor 3 to send the above-mentioned monitoring result via the serial interface 80 or to use the monitoring result for PI [proportinal/integral] calculation of the back electromotive force monitoring circuit 28.

<Continuous Speed Control>

During the continuous speed control of the voice coil motor 3 which is the main constituent for controlling the microcomputer 5, the switches 247a and 247d are turned off (open circuit) and the switches 247b and 247c are turned on (short circuit) in the output feedback circuit 24. The selector 246 selects the first motor control signal S21 inputted from the microcomputer 5 via the serial interface 80 to output the first motor control signal S21 to the D/A converter 242. According to the above-mentioned switching control, the output feedback circuit 24 performs output feedback control of the voice coil motor 3 so as to move the magnetic head at the target speed set by the microcomputer 5.

During the continuous speed control of the voice coil motor 3, the back electromotive force monitoring circuit 28 generates a speed detection voltage VELOUT in accordance with the motor speed (head speed) without stopping the voice coil motor 3 to read voltage value information thereof to the microcomputer via the serial interface 80. Accordingly, it is possible to generate the first motor control signal S21 so that the motor speed can become a desired value in the microcomputer 5. Here, the first motor control signal S21 is provided for the first terminal of the selector 246 via the serial interface 80.

<Discontinuous Speed Control>

During discontinuous speed control of the voice coil motor 3, an ON period Ton and an OFF period Toff (an output high impedance period of the voice coil motor driver 20) of the voice coil motor 3 are repeated alternately. At that time, the back electromotive force monitoring circuit 28 detects the back electromotive force BEMF of the voice coil motor 3 every OFF period Toff of the voice coil motor 3 to generate the second motor control signal S22. On the other hand, the output feedback circuit 24 generates the feedback voltage Vfb from the second motor control signal S22 every ON period Ton of the voice coil motor 3. Accordingly, the output feedback control of the voice coil motor 3 is performed so as to move the magnetic head at predetermined speed in accordance with PI calculation results in the output feedback circuit 24.

Here, the motor drive device 1 performs the discontinuous speed control of the above-mentioned voice coil motor 3 to operate the magnetic head at the predetermined speed safely when the power off retraction of the magnetic head is performed during the power supply interruptions.

<Class-AB Amplifier>

The driver circuits 21 and 22 which form an output stage of the voice coil motor driver 20 function as a class-AB amplifier (a push-pull circuit for class-AB operation) during linear drive. Hereinafter, the driver circuits 21 and 22 will be described in detail with a focus on this point.

Figure 3:
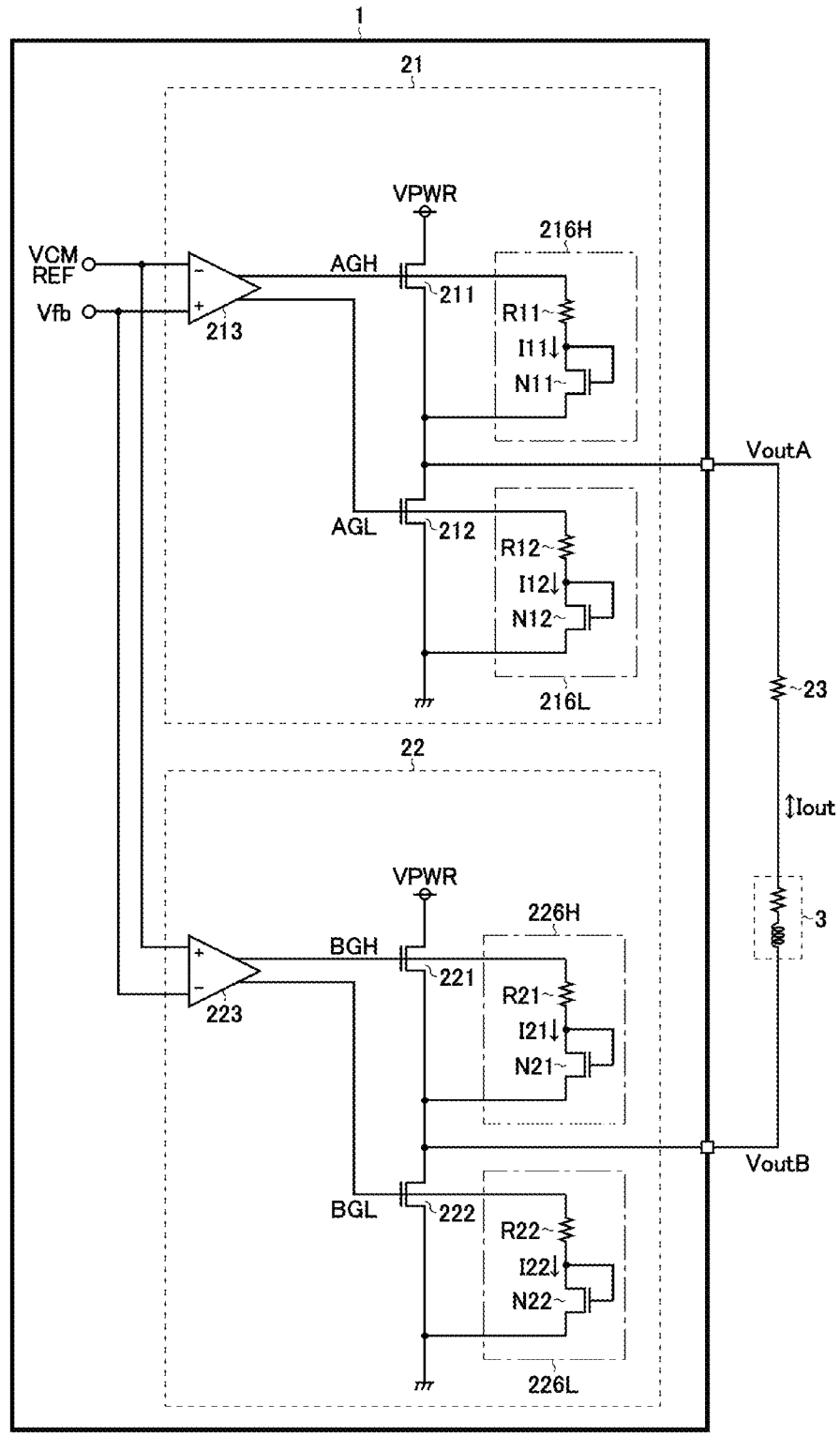
FIG. 3 is a circuit diagram showing a first structural example of driver circuits 21 and 22.

FIG. 3 is a circuit diagram showing a first structural example of driver circuits 21 and 22. The driver circuit 21 in the first structural example includes an upper side idler 216H and a lower side idler 216L besides the above-mentioned output transistors 211 and 212, and linear driver 213. Hereinafter, the output transistor 211 will be referred to as an upper side transistor 211 and the output transistor 212 will be referred to as a lower side transistor 212 for convenience' sake of explanation.

The upper side idler 216H includes a resistor R11 and an N-channel type MOS field effect transistor N11. A first terminal of the resistor R11 is connected to the application terminal of the upper side gate voltage AGH. A second terminal of the resistor R11 is connected to a drain and a gate of the transistor N11. A source of the transistor N11 is connected to the application terminal of the output voltage VoutA.

The upper side idler 216H having the above structure biases the upper side gate voltage AGH by applying an upper side bias current I11 between a gate and a source of the upper side transistor 211 so as to turn on the upper side transistor 211 in the crossover region (the zero-cross region where both the upper side gate voltage AGH and the lower side gate voltage BGL becomes a no-signal state (nearly 0V) as both the voltages match each other or almost match each other) between the feedback voltage Vfb and the reference voltage VCMREF.

The lower side idler 216L includes a resistor R12 and an N-channel type MOS field effect transistor N12. A first terminal of the resistor R12 is connected to the application terminal of the lower side gate voltage AGL. A second terminal of the resistor R12 is connected to a drain and a gate of the transistor N12. A source of the transistor N12 is connected to a ground terminal (the application terminal of the ground voltage GND).

The lower side idler 216L having the above structure biases the lower side gate voltage AGL by applying a lower side bias current I12 between a gate and a source of the lower side transistor 212 so as to turn on the lower side transistor 212 in the crossover region between the feedback voltage Vfb and the reference voltage VCMREF.

The driver circuit 22 in the first structural example includes an upper side idler 22611 and a lower side idler 226L besides the above-mentioned output transistors 221 and 222, and linear driver 223. Hereinafter, the output transistor 221 will be referred to as an upper side transistor 221 and the output transistor 222 will be referred to as a lower side transistor 222 for convenience' sake of explanation.

The upper side idler 226H includes a resistor R21 and an N-channel type MOS field effect transistor N21. A first terminal of the resistor R21 is connected to the application terminal of the upper side gate voltage BGH. A second terminal of the resistor R21 is connected to a drain and a gate of the transistor N21. A source of the transistor N21 is connected to the application terminal of the output voltage VoutB.

The upper side idler 226H having the above structure biases the upper side gate voltage BGH by applying an upper side bias current I21 between a gate and a source of the upper side transistor 221 so as to turn on the upper side transistor 221 in the crossover region between the feedback voltage Vfb and the reference voltage VCMREF.

The lower side idler 226L includes a resistor R22 and an N-channel type MOS field effect transistor N22. A first terminal of the resistor R22 is connected to the application terminal of the lower side gate voltage BGL. A second terminal of the resistor R22 is connected to a drain and a gate of the transistor N22. A source of the transistor N22 is connected to the ground terminal (the application terminal of the ground voltage GND).

The lower side idler 226L having the above structure biases the lower side gate voltage BGL by applying a lower side bias current I22 between a gate and a source of the lower side transistor 222 so as to turn on the lower side transistor 222 in the crossover region between the feedback voltage Vfb and the reference voltage VCMREF.

Figure 4:
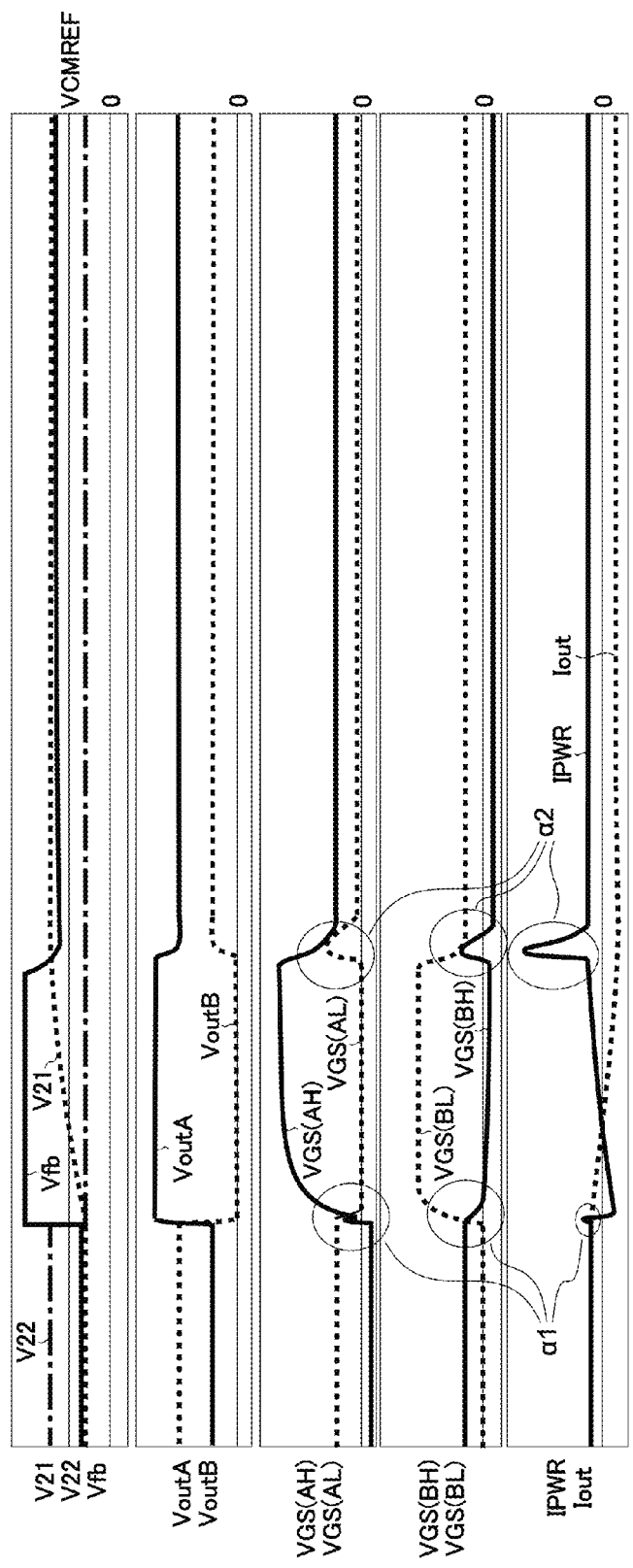
FIG. 4 is a timing chart when a voltage V22 varies steeply in a first structural example.

FIG. 4 is a timing chart when a voltage V22 varies steeply in a first structural example. In the first chart from top, a solid line shows the feedback voltage Vfb, a dashed line shows the voltage V21, and an alternate long and short dash line shows the voltages V22. In the second chart from top, a solid line shows the output voltage VoutA and a dashed line shows the output voltage VoutB. In the third chart from top, a solid line shows a voltage VGS(AH) applied between the gate and the source of the upper side transistor 211 and a dashed line shows a voltage VGS(AL) applied between the gate and the source of the lower side transistor 212. In the fourth chart from top, a solid line shows a voltage VGS(BH) applied between the gate and the source of the upper side transistor 221 and a dashed line shows a voltage VGS(BL) applied between the gate and the source of the lower side transistor 222. In the fifth chart from top, a solid line shows a power supply current IPWR and a dashed line shows the output current Iout.

Here, a direction flowing from the driver circuit 22 toward the driver circuit 21 through the voice coil motor 3 is defined as a positive direction (Iout>0) of the output current Iout. On the other hand, a direction flowing from the application terminal of the power voltage VPWR (the power supply line L1) toward the output stage of the voice coil motor driver 20 is defined as a positive direction (IPWR>0) of the power supply current IPWR. Accordingly, the power supply current IPWR is always positive polarity as far as a reverse current from of the voice coil motor driver 20 toward the power supply line L1 is not generated if the output current Iout flows to a positive or a negative direction.

In the driver circuits 21 and 22, the voltages VGS(AH), VGS(AL), VGS(BH), and VGS(BL) vary freely in accordance with a difference between the feedback voltage Vfb and the reference voltage VCMREF. Therefore, in the driver circuits 21 and 22 in the first structural example, there is a problem that the upper side transistor 221 and the lower side transistor 212 are turned on at the same time or the upper side transistor 221 and the lower side transistor 222 are turned on at the same time, and then a flow-through current flows into the output stages of the driver circuits 21 and 22 when the feedback voltage Vfb varies suddenly.

The above-mentioned problem will be specifically explained while referring to FIG. 4. For example, when the voltage V22 is dropped steeply from a voltage level higher than the reference voltage VCMREF to a voltage lower than the reference voltage VCMREF, the feedback voltage Vfb steeply rises from a voltage level lower than the reference voltage VCMREF to a voltage level (a state swinging to a high level) higher than the reference voltage VCMREF because the voltage V21 can't follow immediately. At this time, the flow-through current flows into each of the output stages (see an area α1 in FIG. 4) because the upper side transistor 211 is turned on in the driver circuit 21 before the lower side transistor 212 is turned off and the lower side transistor 222 is turned on in the driver circuit 22 before the upper side transistor 221 is turned off.

Besides, when the feedback voltage Vfb begin to fall from a voltage level in the state swinging to the high level toward a voltage level in the normal state, an unintentional voltage rise occurs to the voltages VGS(AL) and VGS(AL) in response to this variation. Consequently, the flow-through flows into each of the output stages because the upper side transistor 211 and the lower side transistor 212 are turned on at the same time in the driver circuit 21 and the upper side transistor 221 and the lower side transistor 222 are turned on at the same time in the driver circuit 22 (see an area α2 in FIG. 4).

Here, it is possible to prevent the flow-through current from generating if a filter circuit is introduced to the latter stage of the D/A converter 242 and the voltage V22 is dulled. However, it is impossible to adopt the above-mentioned prevention to a system which requests high speed response because following capability reduces to the motor control signal S21.

Figure 5:
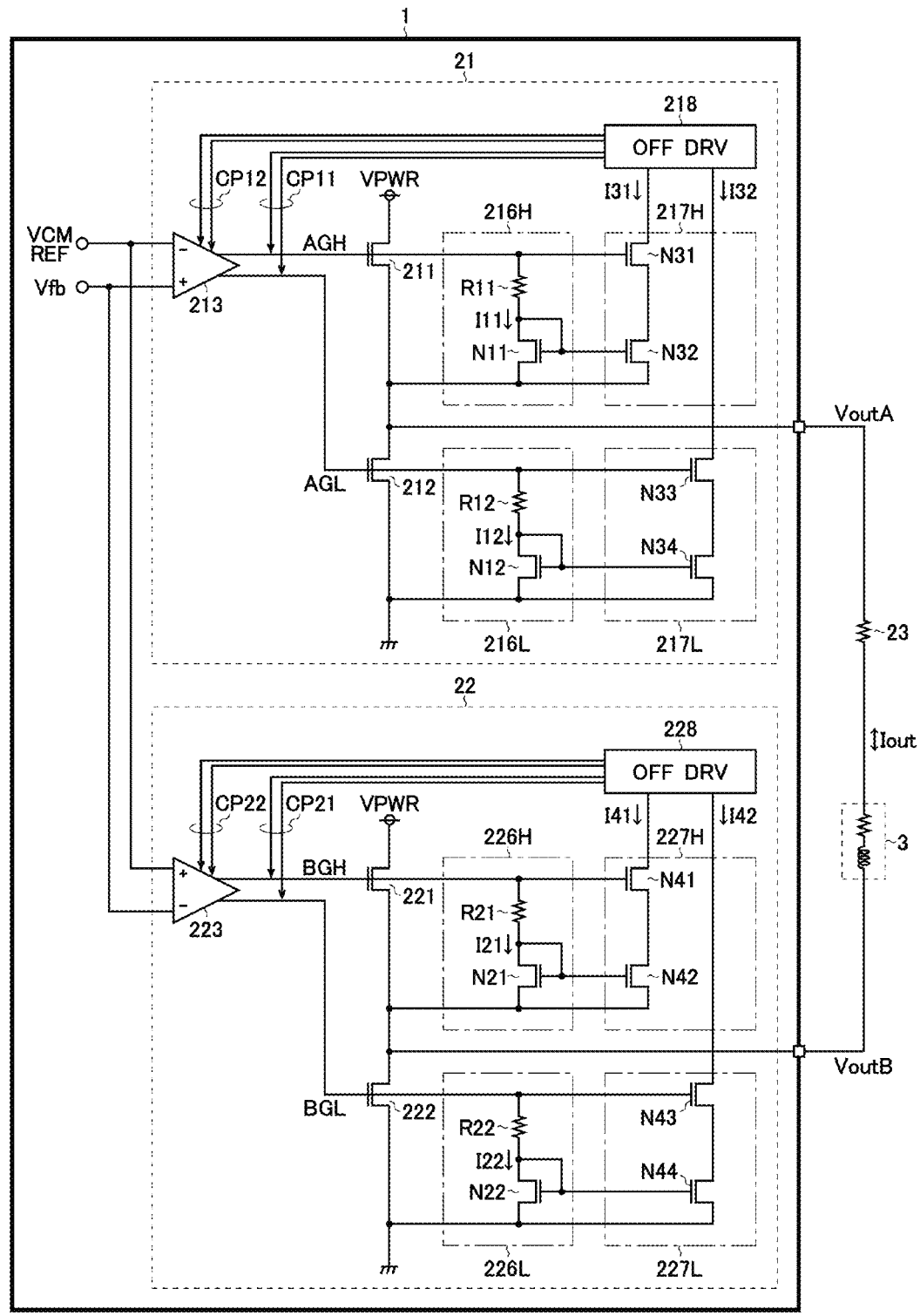
FIG. 5 is a circuit diagram showing a second structural example of driver circuits 21 and 22.

FIG. 5 is a circuit diagram showing a second structural example of driver circuits 21 and 22. The driver circuit 21 in the second structural example is basically the same structure as that in the above-mentioned first structural example, and has a feature of adding the upper side detection current generator 217H, the lower side detection current generator 217L, and the off driver 218.

The upper side detection current generator 217H includes N-channel type MOS field effect transistors N31 and N32. A gate of the transistor N31 is connected to the application terminal of the upper side gate voltage AGH. A drain of the transistor N31 is connected to the off driver 218 as an output terminal of an upper side detection current I31. A gate of the transistor N32 is connected to the gate of the transistor N11. A drain of the transistor N32 is connected to a source of the transistor N31. A source of the transistor N32 is connected to the application terminal of the output voltage VoutA.

The upper side detection current generator 217H having the above structure includes the transistor N32 which forms a current mirror with the transistor N11 of the upper side idler 216H, and generates the upper side detection current I31 in accordance with the upper side bias current I11 using the above-mentioned current mirror when the transistor N31 is turned on.

The upper side detection current generator 217L includes N-channel type MOS field effect transistors N33 and N34. A gate of the transistor N33 is connected to the application terminal of the lower side gate voltage AGL. A drain of the transistor N33 is connected to the off driver 218 as an output terminal of a lower side detection current I32. A gate of the transistor N34 is connected to the gate of the transistor N12. A drain of the transistor N34 is connected to a source of the transistor N33. A source of the transistor N34 is connected to the ground terminal (the application terminal of the ground voltage GND).

The lower side detection current generator 217L having the above structure includes the transistor N34 which forms a current mirror with the transistor N12 of the lower side idler 216L, and generates the lower side detection current I32 in accordance with the lower side bias current I12 using the above-mentioned current mirror when the transistor N33 is turned on.

The off driver 218 controls the lower side gate voltage AGL so as to reduce a degree of conduction of the lower side transistor 212 as the upper side detection current I31 is larger, and controls the upper side gate voltage AGH so as to reduce a degree of conduction of the upper side transistor 211 as the lower side detection current I32 is larger.

At that time, the off driver 218 controls the upper side gate voltage AGH and the lower side gate voltage AGL through at least (both of them in the present structural example) one of first control paths CP11(H/L) connected respectively to each of the gates of the upper side transistor 211 and the lower side transistor 212 and second control paths CP12(H/L) connected respectively to the upper side output stage and the lower side output stage of the linear driver 213.

Besides, the driver circuit 22 in the second structural example is basically the same structure as that in the above-mentioned first structural example, and has a feature of adding the upper side detection current generator 227H, the lower side detection current generator 227L, and the off driver 228.

The upper side detection current generator 227H includes N-channel type MOS field effect transistors N41 and N42. A gate of the transistor N41 is connected to the application terminal of the upper side gate voltage BGH. A drain of the transistor N41 is connected to the off driver 228 as an output terminal of an upper side detection current I41. A gate of the transistor N42 is connected to the gate of the transistor N21. A drain of the transistor N42 is connected to a source of the transistor N41. A source of the transistor N42 is connected to the application terminal of the output voltage VoutB.

The upper side detection current generator 227H having the above structure includes the transistor N42 which forms a current mirror with the transistor N21 of the upper side idler 226H, and generates the upper side detection current I41 in accordance with the upper side bias current I21 using the above-mentioned current mirror when the transistor N41 is turned on.

The upper side detection current generator 227L includes N-channel type MOS field effect transistors N43 and N44. A gate of the transistor N43 is connected to the application terminal of the lower side gate voltage BGL. A drain of the transistor N43 is connected to the off driver 228 as an output terminal of a lower side detection current I42. A gate of the transistor N44 is connected to the gate of the transistor N22. A drain of the transistor N44 is connected to a source of the transistor N43. A source of the transistor N44 is connected to the ground terminal (the application terminal of the ground voltage GND).

The lower side detection current generator 227L having the above structure includes the transistor N44 which forms a current mirror with the transistor N22 of the lower side idler 226L, and generates the lower side detection current I42 in accordance with the lower side bias current I22 using the above-mentioned current mirror when the transistor N43 is turned on.

The off driver 228 controls the lower side gate voltage BGL so as to reduce a degree of conduction of the lower side transistor 222 as the upper side detection current I41 is larger, and controls the upper side gate voltage BGH so as to reduce a degree of conduction of the upper side transistor 221 as the tower side detection current I42 is larger.

At that time, the off driver 228 controls the upper side gate voltage BGH and the lower side gate voltage SGL through at least (both of them in the present structural example) one of first control paths CP21(H/L) connected respectively to each of the gates of the upper side transistor 221 and the lower side transistor 222 and second control paths CP22(H/L) connected respectively to the upper side output stage and the lower side output stage of the linear driver 223.

Figure 6:
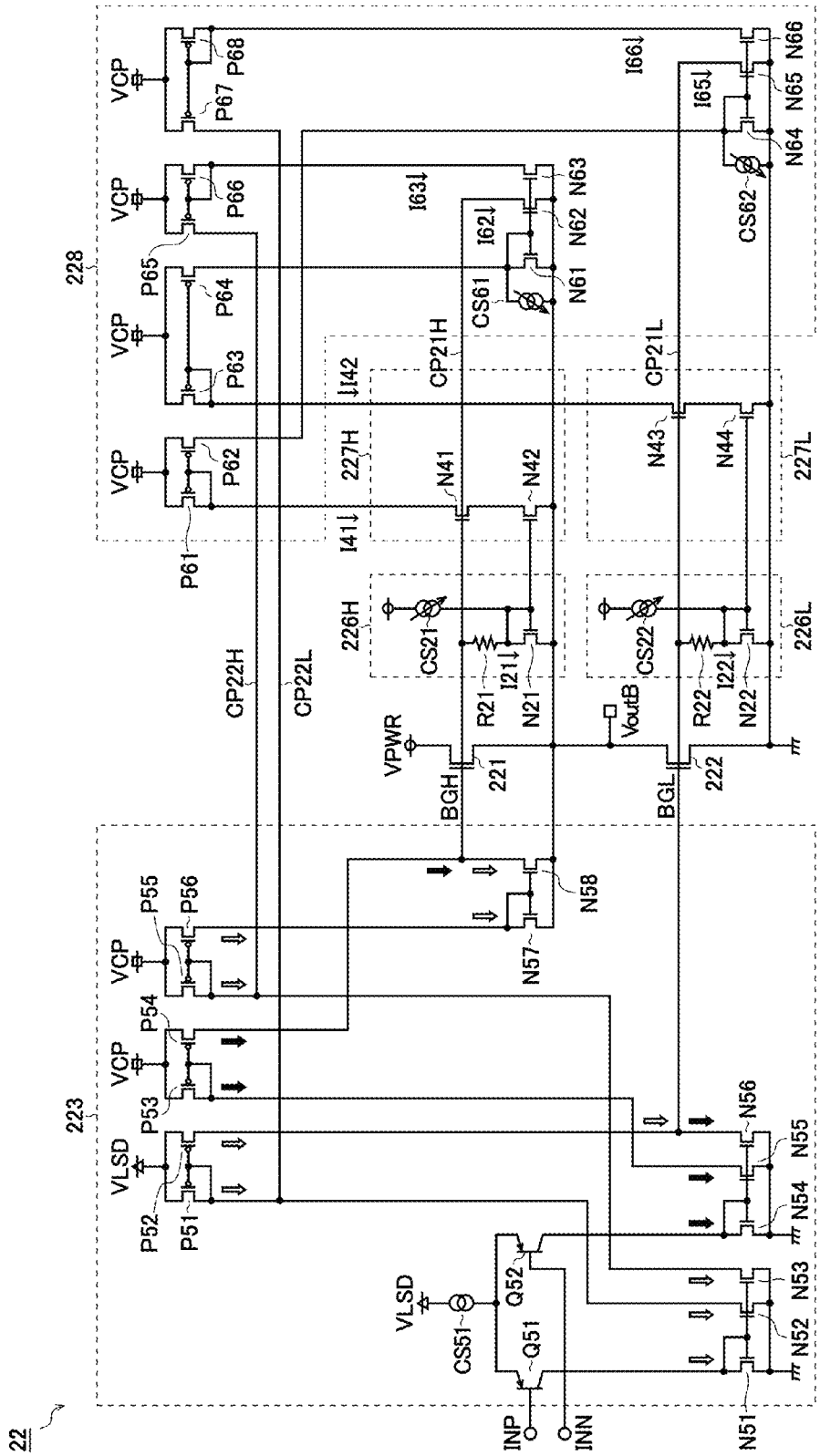
FIG. 6 is a circuit diagram showing a concrete example of a driver circuit 22.

FIG. 6 is a circuit diagram showing a concrete example of a driver circuit 22. A duplicate description of the structure is therefore omitted because the driver circuit 21 is comprised of the same structure as the following driver circuit except that the following input signals INP and INN are contrarily inputted in comparison with the driver circuit 22.

In the driver circuit 22 in the present structural example, the linear driver 223 includes N-channel type MOS field effect transistors N51 to N58, P-channel type MOS field effect transistors P51 to N56, pnp type bipolar transistors Q51 and Q52, and a current source CS51.

Emitters if the transistors Q51 and Q52 are connected to an application terminal of the internal power supply voltage VLSD (e.g., 5V) via the current source CS51. A base of the transistor Q51 is connected to an application terminal of the input signal INP (=reference voltage VCMREF) as a non-inverting input terminal (+) of the linear driver 223. A base of the transistor Q52 is connected to an application terminal of the input signal INN (=feedback voltage Vfb) as an inverting input terminal (−) of the linear driver 223.

Gates of the transistors N51 to N53 are connected to a drain of the transistor N51. Sources of the transistors N51 to N53 are connected to the ground terminal. The drain of the transistor N51 is connected to a collector of the transistor Q51. A drain of the transistor N52 is connected to a drain of the transistor P51. A drain of the transistor N53 is connected to a drain of the transistor P55.

Gates of the transistors N54 to N56 are connected to a drain of the transistor N54. Sources of the transistors N54 to N56 are connected to the ground terminal. The drain of the transistor N54 is connected to a collector of the transistor Q52. A drain of the transistor N55 is connected to a drain of the transistor P53. A drain of the transistor N56 is connected to the gate of the lower side transistor 222.

Sources of the transistors P51 and P52 are connected to the application terminal of the internal power supply voltage VLSD. Gates of the transistors P51 and P52 are connected to the drain of the transistor P51. A drain of the transistor P52 is connected to the gate of the lower side transistor 222.

Sources of the transistors P53 and P54 are connected to an application terminal of the step-up voltage VCP (=VPWR+5V). Gates of the transistors P53 and P54 are connected to the drain of the transistor P53. A drain of the transistor P54 is connected to the gate of the upper side transistor 221.

Sources of the transistors P55 and P56 are connected to the application terminal of the step-up voltage VCP. Gates of the transistors P55 and P56 are connected to the drain of the transistor P55. A drain of the transistor P56 is connected to a drain of the transistor N57.

Gates of the transistors N57 and N58 are connected to the drain of the transistor N57. Sources of the transistors N57 and N58 are connected to the application terminal of the output voltage VoutB. A drain of the transistor N58 is connected to the gate of the upper side transistor 221.

In the linear driver 223 having the above structure, in case of INP>INN (VCMREF>Vfb), the upper side gate voltage BGH becomes higher than the lower side gate voltage BGL because a corrector current of the transistor Q51 and a mirror current thereof (see white arrows on a colored background) becomes smaller than a corrector current of the transistor Q52 and a mirror current thereof (see black arrows). To the contrary, in case of INP<INN (VCMREF<Vfb), the upper side gate voltage BGH becomes smaller than the lower side gate voltage BGL because a corrector current of the transistor Q51 and a mirror current thereof (see white arrows on a colored background) becomes larger than a corrector current of the transistor Q52 and a mirror current thereof (see black arrows).

In the driver circuit 22 in the present structural example, the upper side idler 226H and the lower side idler 226L respectively include the current sources CS21 and CS22 applying adjustment currents into the drains of the transistors N21 and N22. According to such a structure, an amount of bias of the upper side gate voltage BGH and the lower side gate voltage BGL is optionally adjusted. Therefore, it is possible to optimize an idling current Iid (an extremely small flow-through current) flowing from the upper side transistor 221 to the lower side transistor 222 in the crossover region between the feedback voltage Vfb and the reference voltage VCMREF.

Besides, in the driver circuit 22 in the present structural example, the off driver 228 includes N-channel type MOS field effect transistors N61 to N66, P-channel type MOS field effect transistors P61 to N68, and current sources CS61 and CS62.

Sources of the transistors P61 and P62 are connected to the application terminal of the step-up voltage VCP. Gates of the transistors P61 and P62 are connected to the drain of the transistor P61. The drain of the transistor P61 is connected to the drain of the transistor N41.

Sources of the transistors P63 and P64 are connected to the application terminal of the step-up voltage VCP. Gates of the transistors P63 and P64 are connected to the drain of the transistor P63. The drain of the transistor P63 is connected to the drain of the transistor N43.

Sources of the transistors P65 and P66 are connected to the application terminal of the step-up voltage VCP. Gates of the transistors P65 and P66 are connected to the drain of the transistor P66. A drain of the transistor P65 is connected to the drain of the transistor P55.

Sources of the transistors P67 and P68 are connected to the application terminal of the step-up voltage VCP. Gates of the transistors P67 and P68 are connected to the drain of the transistor P68. A drain of the transistor P67 is connected to the drain of the transistor P51.

Gates of the transistors N61 to N63 are connected to a drain of the transistor N61. Sources of the transistors N61 to N63 are connected to the application terminal of the output voltage VoutB. The drain of the transistor N61 is connected to a drain of the transistor P64. A drain of the transistor N62 is connected to the application terminal of the upper side gate voltage BGH. A drain of the transistor N63 is connected to a drain of the transistor P66.

Gates of the transistors N64 to N66 are connected to a drain of the transistor N64. Sources of the transistors N64 to N66 are connected to the ground terminal. The drain of the transistor N64 is connected to a drain of the transistor P62. A drain of the transistor N65 is connected to the application terminal of the lower side gate voltage BGL. A drain of the transistor N66 is connected to a drain of the transistor P68.

The current source CS61 is connected between the source and the drain of the transistor N61. The current source CS62 is connected between the source and the drain of the transistor N64.

In the off driver 228 having the above structure, the transistors P61 and P62, the transistors N64 to N66, and the transistors P67 and P68 function as a first current minor which mirrors the upper side detection current I41 to generate lower side off currents I65 and I66. The lower side current I65 is a current signal for directly controlling the lower side gate voltage BGL through a first control path CP21L connected to the gate of the lower side transistor 222. Besides, the lower side current I66 is a current signal for indirectly controlling the lower side gate voltage BGL through a second control path CP22L connected to the lower side output stage of the linear driver 223 (the drain of the transistor P51 in the present structural example).

According to such a structure, the lower side gate voltage BGL is controlled (reduced) so as to reduce the degree of conduction of the lower side transistor 222 as the upper side detection current I41 is larger. Therefore, it is possible to turn off the lower side transistor 222 certainly when the upper side transistor 221 is turned on.

Besides, in the off driver 228 having the above structure, the transistors P63 and P64, the transistors N61 to N63, and the transistors P65 and P66 function as a second current mirror which mirrors the lower side detection current I42 to generate upper side off currents I62 and I63. The upper side current I62 is a current signal for directly controlling the upper side gate voltage BGH through a first control path CP21H connected to the gate of the upper side transistor 221. Besides, the lower side current I63 is a current signal for indirectly controlling the upper side gate voltage BGH through a second control path CP22H connected to the upper side output stage of the linear driver 223 (the drain of the transistor P55 in the present structural example).

According to such a structure, the upper side gate voltage BGH is controlled (reduced) so as to reduce the degree of conduction of the upper side transistor 221 as the lower side detection current I42 is larger. Therefore, it is possible to turn off the upper side transistor 221 certainly when the lower side transistor 222 is turned on.

Here, in the off driver 228 having the above structure, a predetermined input offset is applied to the first current mirror not so as to generate the lower side off current I65 and I66 as far as the upper side detection current I41 does not exceed a predetermined value, and a predetermined input offset is applied to the second current mirror not so as to generate the upper side off current I62 and I63 as far as the lower side detection current I42 does not exceed a predetermined value.

More specifically, the first current mirror is structured so as to generate the lower side off currents I65 and I66 only when a mirror current (corresponding to the upper side detection current I41) flowing into the drain of the transistor N64 is larger than a constant current drawn to the current source CS62. The second current mirror is structured so as to generate the upper side off currents I62 and I63 only when a mirror current (corresponding to the lower side detection current I42) flowing into the drain of the transistor N61 is larger than a constant current drawn to the current source CS61.

According to such a structure, compulsory off functions of the upper side transistor 221 and the lower side transistor 222 by the off driver 228 does not work in the crossover region between the feedback voltage Vfb and the reference voltage VCMREF (a region where the upper side detection current I41 and the lower side detection current I42 does not exceed a predetermined value if the upper side transistor 221 and the lower side transistor 222 are turned on). Accordingly, it is possible to reduce crossover distortion by applying the idling current Iid to both the upper side transistor 221 and the lower side transistor 222.

Figure 7:
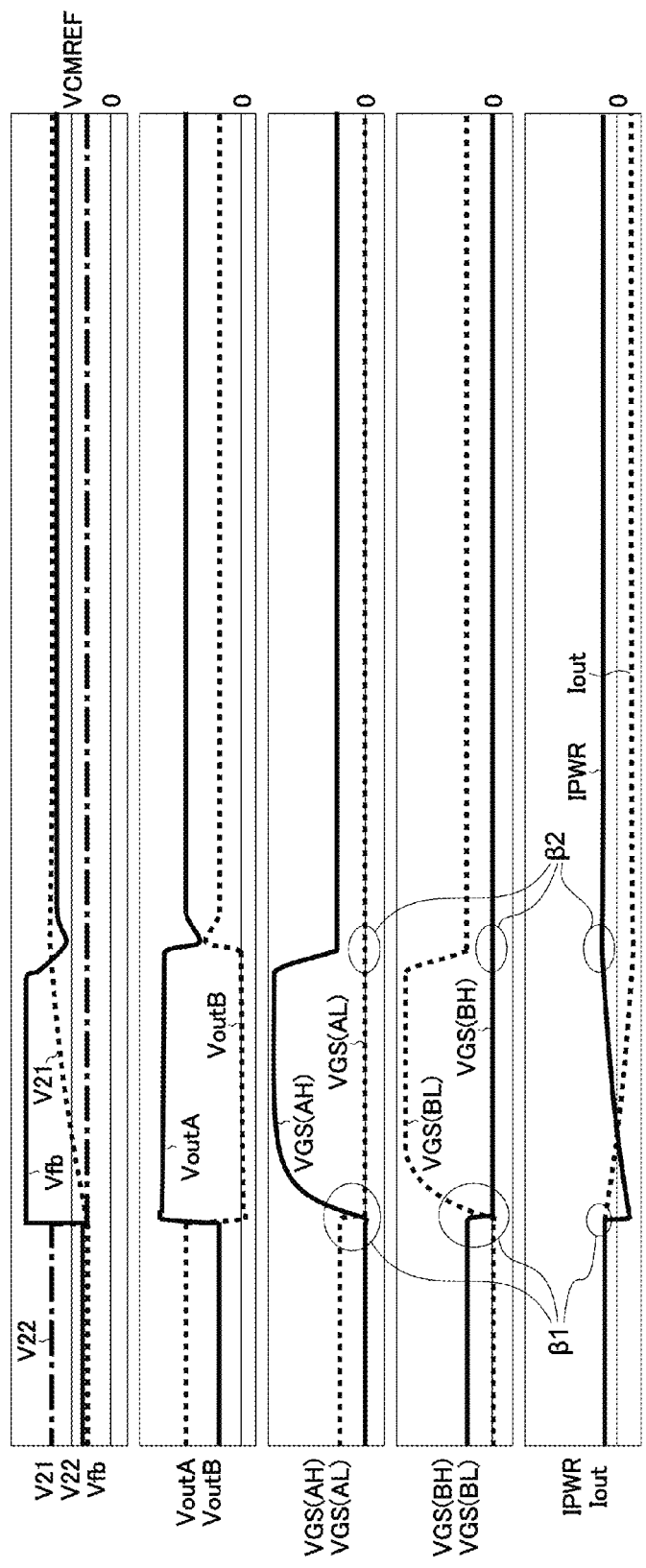
FIG. 7 is a timing chart when a voltage V22 varies steeply in a second structural example.

FIG. 7 is a timing chart when a voltage V22 varies steeply in a second structural example, and shows the feedback voltage Vfb, the voltages V21 and V22, the output voltages VoutA and VoutB, the voltages VGS(AH) and VGS(AL), the voltages VGS(BH) and VGS(BL), the power supply current IPWR, and the output current Iout, in correspondence with FIG. 4.

In FIG. 7, in correspondence with FIG. 4, when the voltage V22 is dropped steeply from the voltage level higher than the reference voltage VCMREF to the voltage lower than the reference voltage VCMREF, the feedback voltage Vfb steeply rises from the voltage level lower than the reference voltage VCMREF to the voltage level (the state swinging to the high level) higher than the reference voltage VCMREF. At this time, the voltage VGS(AL) (=AGL) is reduced in the driver circuit 21 as the voltage VGS(AH) (=AGH−VoutA) becomes larger, and the voltage VGS(BH) (=BGH−VoutB) is reduced in the driver circuit 22 as the voltage VGS(BL) (=BGL) becomes larger. Accordingly, the flow-through current does not flow into each of the output stages because both the upper side transistors 211 and 221 and the lower side transistors 212 and 222 are not turned on at the same time (see an area β1 in FIG. 7).

Besides, when the feedback voltage Vfb begin to fall from a voltage level in the state swinging to the high level toward a voltage level in the normal state, an unintentional voltage rise is held down to the voltages VGS(AL) and VGS(BL) with operation of the off drivers 218 and 228. Therefore, the flow-through current does not flow into each of the output stages because both the upper side transistors 211 and 221 and the lower side transistors 212 and 222 are not turned on at the same time (see an area β2 in FIG. 7).

According to the driver circuits 21 and 22 in the second structural example, it is possible to be applied to a system which requests high speed response without introducing the filter circuit to the latter stage of the D/A converter 242

Figure 8:
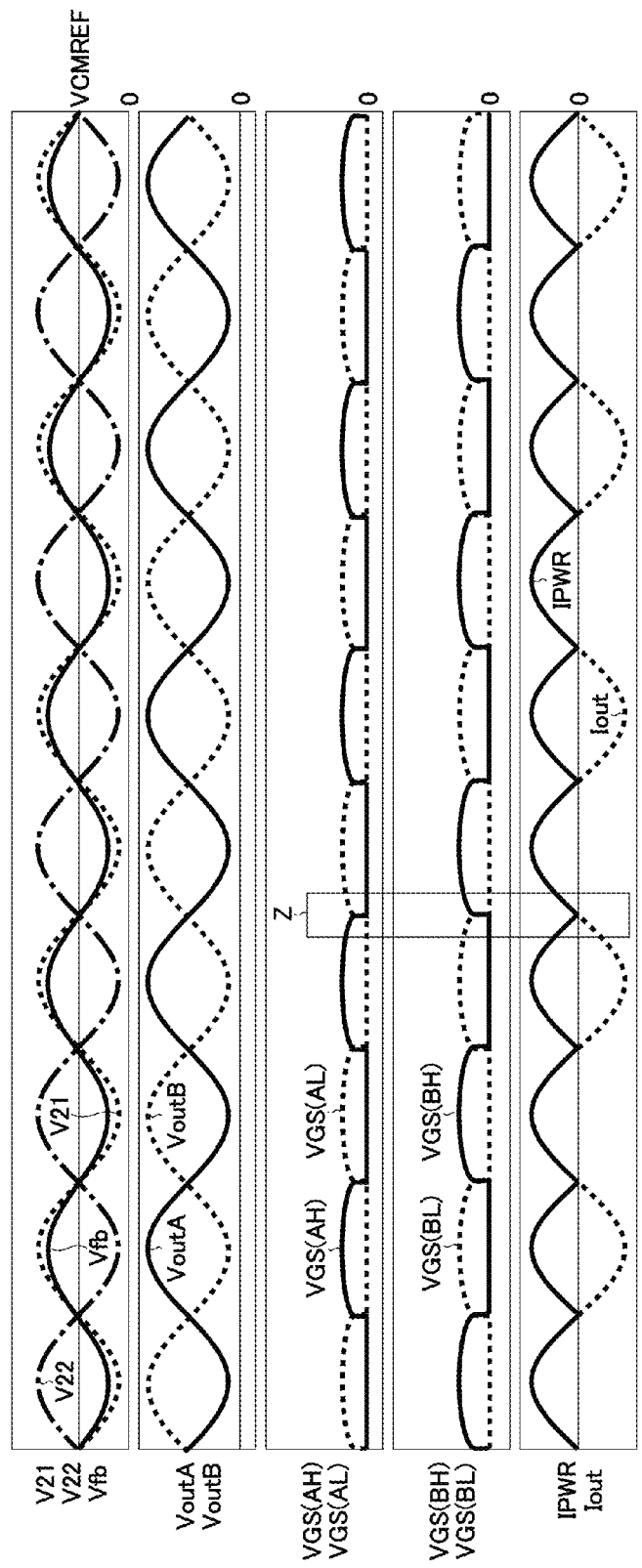
FIG. 8 is a timing chart when a voltage V22 changes into a sine wave shape in a second structural example.
Figure 9:
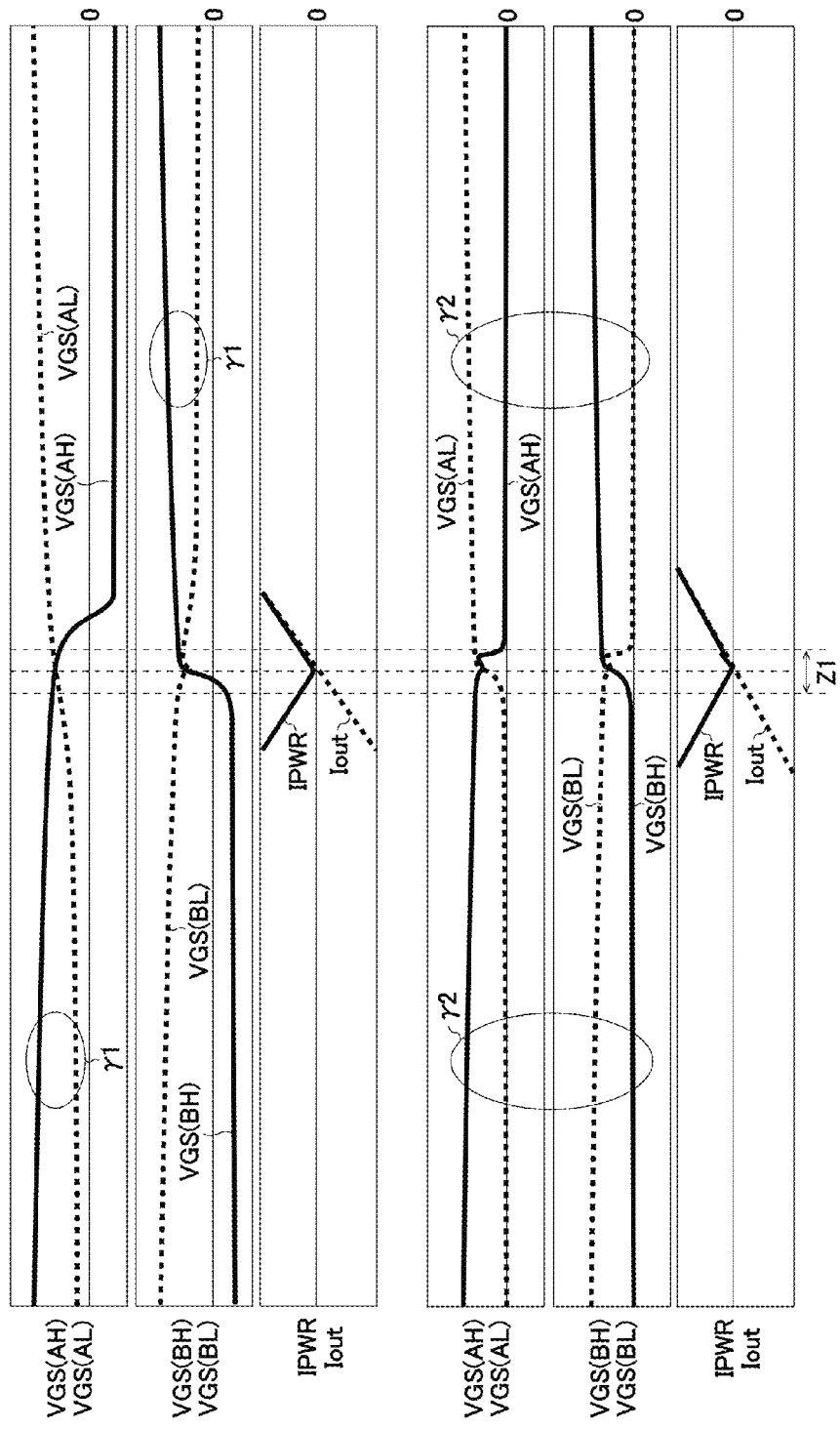
FIG. 9 is a partial enlarged diagram of a range Z.

FIG. 8 is a timing chart when a voltage V22 changes into a sine wave shape in a second structural example. In correspondence with FIG. 4 and FIG. 7, FIG. 8 shows the feedback voltage Vfb, the voltages V21 and V22, the output voltages VoutA and VoutB, the voltages VGS(AH) and VGS(AL), the voltages VGS(BH) and VGS(BL), the power supply current IPWR, and the output current Iout. Besides, FIG. 9 is a partial enlarged diagram of a range Z in FIG. 8. Here, behavior of the second structural example is described in a lower portion in FIG. 9, and behavior of the first structural example is described in an upper portion in FIG. 9 for the purpose of comparison.

In comparison with the upper portion and the lower portion in FIG. 9, a first structural example has a period when both the voltages VGS(AH) and VGS(AL) is positive or a period when both the voltages VGS(BH) and VGS(BL) is positive except for a crossover region Z1 which the class-AB operation needs. In such periods, the unnecessary idling current Iid flows (see an area γ1 in FIG. 9) because both the upper side transistor 211 and the lower side transistor 212 or both the upper side transistor 221 and the lower side transistor 222 are turned on at the same time.

In contrast, the second structural example limits a period when both the voltages VGS(AH) and VGS(AL) is positive or a period when both the voltages VGS(BH) and VGS(BL) is positive to only the crossover region Z1. Except for the crossover region Z1, when one of the voltages VGS(AH) and VGS(AL) is positive, the other of them is reduced to 0V, and besides, when one of the voltages VGS(BH) and VGS(BL) is positive, the other of them is reduced to 0V (see an area γ2 in FIG. 9).

According to the above-mentioned operation of the off drivers 218 and 228, in the crossover region Z1, both the upper side transistor 211 and the lower side transistor 212 or both the upper side transistor 221 and the lower side transistor 222 are turned on at the same time, and then the extremely small idling currents Iid flow into both sides. On the other hand, except for the crossover region Z1, it is forbidden that both the upper side transistor 211 and the lower side transistor 212 or both the upper side transistor 221 and the lower side transistor 222 are turned on at the same time, and then the idling currents Iid becomes zero. Therefore, it is possible to reduce power consumption in comparison with a conventional structure which always applies the idling currents Iid to the output stage.

<Application to Hard Disk Drive>

Figure 10:
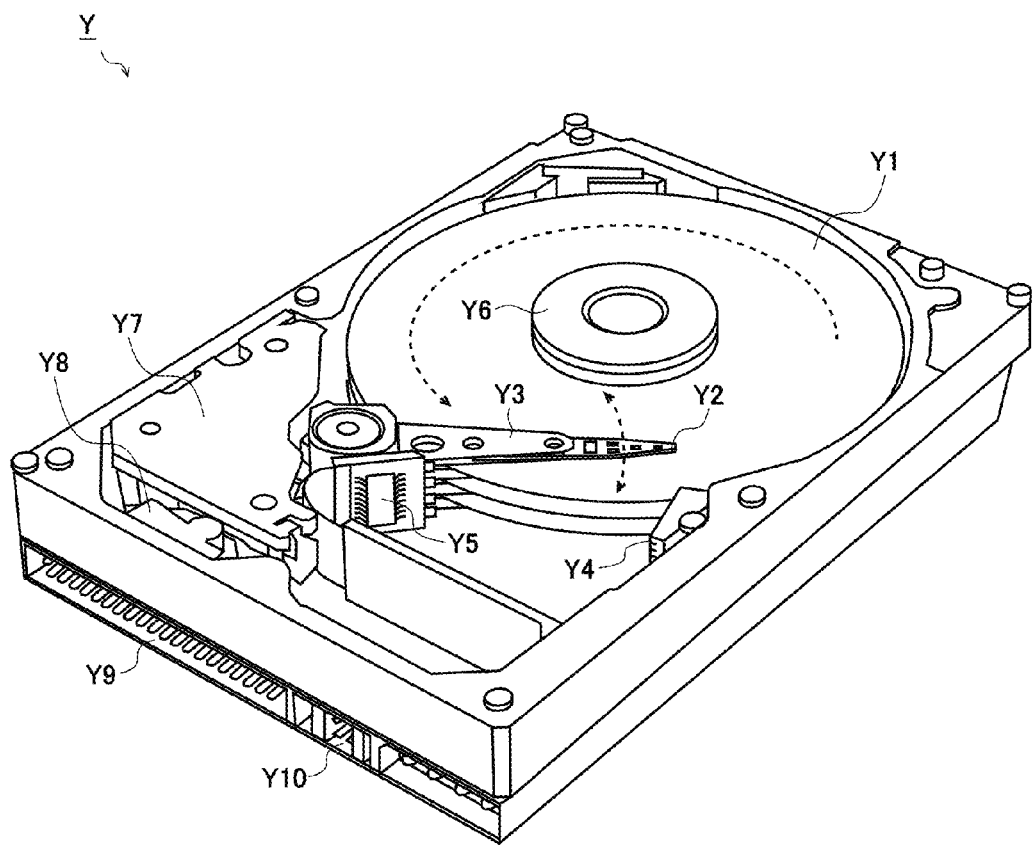
FIG. 10 is a perspective view showing a structural example of a hard disk drive provided with a motor drive device.

FIG. 10 is a perspective view (with a top cover removed) showing a structural example of a hard disk drive that incorporates the motor drive device. A hard disk drive Y in the present structural example is a kind of magnetic disk storage device and has: a platter Y1; a magnetic head Y2; a swing arm Y3; a lamp mechanism Y4; a head amplifier Y5; a spindle motor Y6; a voice coil motor Y7; a latch mechanism Y8; an interface connector Y9; and a jumper switch Y10.

The platter Y1 is a magnetic disk that is formed by laminating a magnetic layer on a surface of an aluminum board or a glass board. One hard disk drive Y incorporates one to four platters Y1.

The magnetic head Y2 reads and writes data to and from the platter Y1.

The swing arm Y3 holds the magnetic head Y2 at a tip end thereof.

The lamp mechanism Y4 is an evacuation place for the magnetic head Y2 during a time the platter Y1 does not rotate, and is disposed further outside an outermost circumference of the platter Y1

The head amplifier Y5 amplifies a regenerative signal obtained by the magnetic head Y2.

The spindle motor Y6 (corresponding to the spindle motor 2 in FIG. 1) rotates the platter Y1 at predetermined rotation speeds (4200 rpm, 5400 rpm, 7200 rpm, 10000 rpm, 15000 rpm and the like).

The voice coil motor Y7 (corresponding to the voice coil motor 3 in FIG. 1) moves the swing arm Y3 in an arc, thereby moving the magnetic head Y2 in a radial direction of the platter Y1.

The latch mechanism Y8 holds the swing arm Y3 during a time the hard disk drive Y is stopped.

The interface connector Y9 is connected to a host interface circuit, which is mounted on a mother board of a personal computer and the like, over a cable.

The jumper switch Y10 is a switch for performing the machine setting (master/slave and the like) of the hard disk drive Y by means of a jumper pin when connecting a plurality of the hard disk drives to one personal computer.

Here, though not shown in FIG. 10, the hard disk drive Y is provided with a printed board on which the microcomputer (Soc) and various electronic circuits are mounted. The motor drive device 1 in FIG. 1 is mounted on the above-mentioned printed board as a means for driving the spindle motor Y6 and the voice coil motor Y7.

<Application to Desktop Personal Computer>

Figure 11:
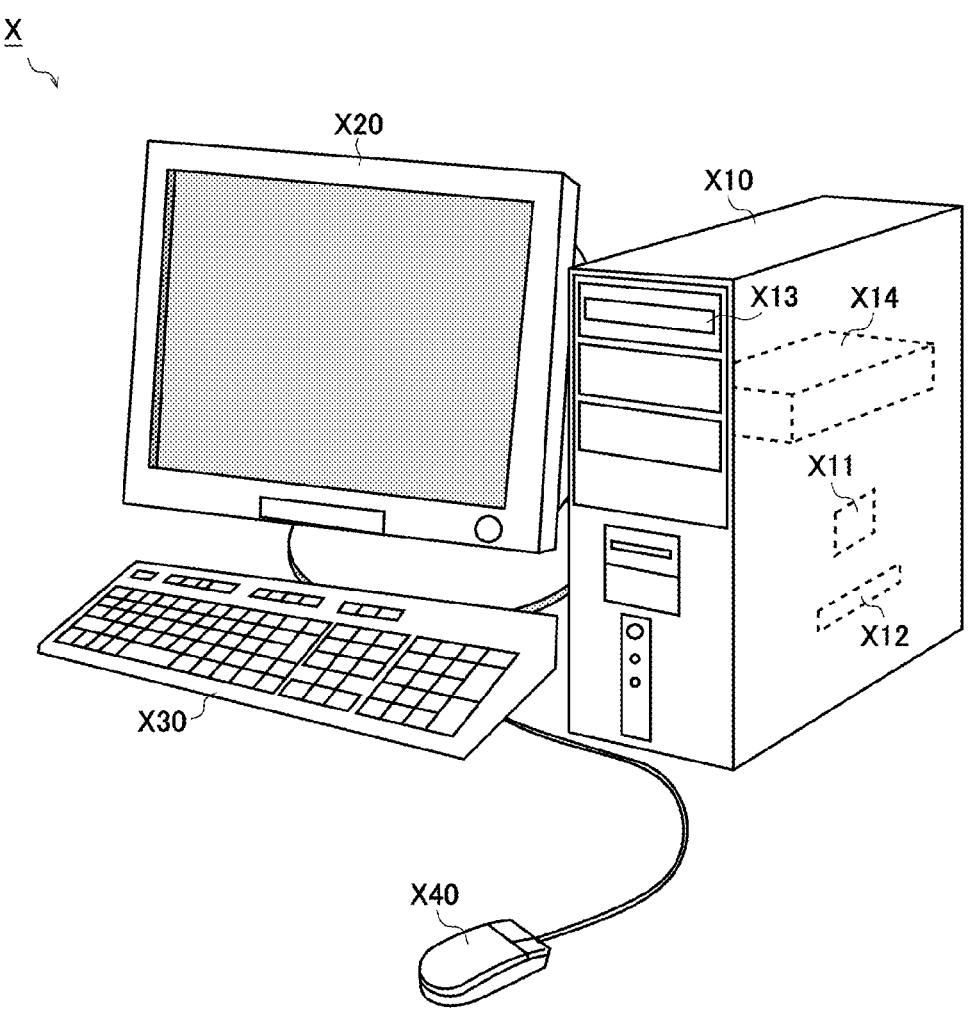
FIG. 11 is an appearance view showing a structural example of a personal computer that incorporates a hard disk drive.

FIG. 11 is an appearance view showing a structural example of a desktop personal computer that incorporates the hard disk drive. A desktop personal computer X in the present structural example has: a main body case X10; a liquid crystal monitor X20; a keyboard X30; and a mouse X40.

The main body case X10 houses: a central processing unit X11; a memory X12; an optical drive X13; a hard disk drive X14 and the like.

The central processing unit X11 executes an operating system and various application programs stored in the hard disk drive X14, thereby controlling comprehensively operation of the desktop personal computer X.

The memory X12 is used as a working region (e.g., a region for storing task data when executing a program) for the central processing unit X11.

The optical drive X13 performs reading/writing of data to and from an optical disk. As the optical disk, there are a CD [compact disk], a DVD [digital versatile disc], a BD [Blu-ray disc] and the like.

The hard disk drive X14 (corresponding to the hard disk drive Y in FIG. 10) is a large-capacity auxiliary storage device that stores the programs and data in a non-volatile way by means of a magnetic disk sealed tightly in the housing.

The liquid crystal monitor X20 outputs an image based on an instruction from the central processing unit X11.

The keyboard X30 and the mouse X40 are each a human interface device that accepts operation by a user.

<Other Modifications>

In the above embodiments, a hard disk drive is given as an example of applications which incorporate the motor drive device. Besides, it is possible to incorporate the motor drive device into the applications other than the hard disk drive.

In addition, in the above embodiments, a desktop personal computer is given as an example of electronic apparatus which incorporate the hard disk drive. Besides, it is possible to incorporate the hard disk drive into the electronic apparatus (laptop computers, tablet personal computers, hard disk recorders, audio players, game machines and the like) other than the desktop personal computer.

Besides, in addition to the above embodiments, it is possible to add various modifications to the invention disclosed in the present specification without departing the spirit of the technological creation. In other words, it should be understood that the above embodiments are examples in all respects and are not limiting, the technological scope of the present invention is not indicated by the above embodiments but by the claims, and all modifications within the scope of the claims and the meaning equivalent to the claims are covered.

Industrial Applicability

The invention disclosed in the present specification is usable, for example, as a system motor driver LSI for a HDD [hard disk drive] controller.

LIST OF REFERENCE NUMERALS 1 motor drive device (semiconductor integrated circuit device)
2 spindle motor
3 voice coil motor
3a coil
3b resistance component
4 capacitor
5 microcomputer (SoC)
10 spindle motor driver
20 voice coil motor driver
21, 22 driver circuits (class-AB amplifiers)
211, 221 output transistors (upper side)
212, 222 output transistors (lower side)
213, 223 linear drivers
214, 215, 224, 225 pre-drivers
216H, 226H upper side idlers
216L, 226L lower side idlers
217H, 227H upper side detection current generators
217L, 227L lower side detection current generators
218, 228 off drivers
23 sense resistor
24 output feedback circuit
241 operational amplifier
242 D/A converter
243 error amplifier
244a to 244g resistors
245 capacitor
246 selector
247a to 247d switches
25 PWM signal generation circuit
251 oscillator
252, 253 comparators
26 output voltage monitoring circuit
261, 262 comparators
27 control circuit
28 back electromotive force monitoring circuit
30 isolation switch (NMOSFET)

40 power voltage monitor
50 A/D converter
60 logic unit
70 register
80 serial interface
90 charge pump
100, 110, 120 internal regulators (digital/analog/lower side gates)
130 step-down switching regulator (positive output type)
140 inverting switching regulator (negative output type)
150 step-up switching regulator (positive and negative output type)
N11, N12 N-channel type MOS field effect transistors
R11, R12 resistors
N21, N22 N-channel type MOS field effect transistors
R21, R22 resistors
CS21, CS22 current source
N31 to N34 N-channel type MOS field effect transistors
N41 to N44 N-channel type MOS field effect transistors
N51 to N58 N-channel type MOS field effect transistors
P51 to P56 P-channel type MOS field effect transistors
Q51, Q52 pup type bipolar transistors
CS51 current source
N61 to N66 N-channel type MOS field effect transistors
P61 to P68 P-channel type MOS field effect transistors
CS61, CS62 current source
L1 power supply line
X desktop personal computer
X10 main body case
X11 central processing unit
X12 memory
X13 optical drive
X14 hard disk drive
X20 liquid crystal monitor
X30 keyboard
X40 mouse
Y hard disk drive
Y1 platter (magnetic disk)
Y2 magnetic head
Y3 swing arm
Y4 lamp mechanism
Y5 head amplifier
Y6 spindle motor
Y7 voice coil motor
Y8 latch mechanism
Y9 interface connector
Y10 jumper switch

What is claimed is:

1. A class-AB amplifier comprising:
an upper side transistor which is connected between an application terminal of a first power supply voltage and an application terminal of an output voltage;
a lower side transistor which is connected between an application terminal of a second power supply voltage and the application terminal of the output voltage;
a linear driver which generates an upper side gate voltage and a lower side gate voltage varying continuously with reverse polarity in accordance with an input voltage and a reference voltage to output the upper side gate voltage and the lower side gate voltage to the upper side transistor and the lower side transistor;
an upper side idler which biases the upper side gate voltage by applying an upper side bias current between an application terminal of the upper side gate voltage and the application terminal of the output voltage so as to turn on the upper side transistor in a crossover region between the input voltage and the reference voltage;
a lower side idler which biases the lower side gate voltage by applying a lower side bias current between an application terminal of the lower side gate voltage and the application terminal of the second power supply voltage so as to turn on the lower side transistor in the crossover region;
an upper side detection current generator which generates an upper side detection current in accordance with the upper side bias current;
a lower side detection current generator which generates a lower side detection current in accordance with the lower side bias current; and
an off driver which controls the lower side gate voltage so as to reduce a degree of conduction of the lower side transistor as the upper side detection current is larger, and controls the upper side gate voltage so as to reduce a degree of conduction of the upper side transistor as the lower side detection current is larger.

2. The class-AB amplifier according to claim 1, wherein
in the crossover region, both the upper side transistor and the lower side transistor are turned on at the same time and then the extremely small idling currents flow into both sides, and
except for the crossover region, it is forbidden that both the upper side transistor and the lower side transistor are turned on at the same time and then the idling currents becomes zero.

3. The class-AB amplifier according to claim 2, wherein
the off driver controls the upper side gate voltage and the lower side gate voltage through at least one of first control paths connected respectively to each of the gates of the upper side transistor and the lower side transistor and second control paths connected respectively to an upper side output stage and a lower side output stage of the linear driver.

4. The class-AB amplifier according to claim 1, wherein
the upper side idler includes:
a first resistor having a first terminal which is connected to the application terminal of the upper side gate voltage; and
a first transistor having a drain and a gate which are connected to a second terminal of the first resistor and having a source which is connected to the application terminal of the output voltage, and
the lower side idler includes:
a second resistor having a first terminal which is connected to the application terminal of the lower side gate voltage; and
a second transistor having a drain and a gate which are connected to a second terminal of the second resistor and having a source which is connected to the application terminal of the second power supply voltage.

5. The class-AB amplifier according to claim 4, wherein
the upper side detection current generator includes:
a third transistor having a gate which is connected to the application terminal of the upper side gate voltage and having a drain which is connected to the off driver as an output terminal of the upper side detection current; and
a fourth transistor having a gate which is connected to the gate of the first transistor, having a drain which is connected to a source of the third transistor, and having a source which is connected to the application terminal of the output voltage, and
the lower side detection current generator includes:
a fifth transistor having a gate which is connected to the application terminal of the lower side gate voltage and having a drain which is connected to the off driver as an output terminal of the lower side detection current; and a sixth transistor having a gate which is connected to the gate of the second transistor, having a drain which is connected to a source of the fifth transistor, and having a source which is connected to the application terminal of the second power supply voltage.

6. The class-AB amplifier according to claim 5, wherein the upper side idler further includes:
a first current source which applies a first adjustment current into the drain of the first transistor, and
the lower side idler further includes:
a second current source which applies a second adjustment current into the drain of the second transistor.

7. The class-AB amplifier according to claim 6, wherein the off driver includes:
a first current minor which mirrors the upper side detection current to generate a lower side off current; and
a second current minor which mirrors the lower side detection current to generate a upper side off current, wherein
the off driver controls at least one of the gate of the lower side transistor and the lower side output stage of the linear driver using the lower side off current, and controls at least one of the gate of the upper side transistor and the upper side output stage of the linear driver using the upper side off current.

8. The class-AB amplifier according to claim 7, wherein the first current minor and the second current mirror apply input offsets not so as to generate the lower side off current and the upper side off current as far as the upper side detection current and the lower side detection current do not exceed predetermined values respectively.

9. A motor drive device comprising:
a voice coil motor driver which drives a voice coil motor, wherein
the voice coil motor driver includes each of the class-AB amplifier as a pair of driver circuits for generating output currents to the voice coil motor, and wherein
the class-AB amplifier comprising:
an upper side transistor which is connected between an application terminal of a first power supply voltage and an application terminal of an output voltage;
a lower side transistor which is connected between an application terminal of a second power supply voltage and the application terminal of the output voltage;
a linear driver which generates an upper side gate voltage and a lower side gate voltage varying continuously with reverse polarity in accordance with an input voltage and a reference voltage to output the upper side gate voltage and the lower side gate voltage to the upper side transistor and the lower side transistor;
an upper side idler which biases the upper side gate voltage by applying an upper side bias current between an application terminal of the upper side gate voltage and the application terminal of the output voltage so as to turn on the upper side transistor in a crossover region between the input voltage and the reference voltage;
a lower side idler which biases the lower side gate voltage by applying a lower side bias current between an application terminal of the lower side gate voltage and the application terminal of the second power supply voltage so as to turn on the lower side transistor in the crossover region;
an upper side detection current generator which generates an upper side detection current in accordance with the upper side bias current;

a lower side detection current generator which generates a lower side detection current in accordance with the lower side bias current; and
an off driver which controls the lower side gate voltage so as to reduce a degree of conduction of the lower side transistor as the upper side detection current is larger, and controls the upper side gate voltage so as to reduce a degree of conduction of the upper side transistor as the lower side detection current is larger.

10. The motor drive device according to claim 9, wherein the voice coil motor driver further includes:
an output feedback circuit which monitors the output current to generate a feedback voltage, wherein
the pair of driver circuits receive the feedback voltage as the input voltage respectively.

11. The motor drive device according to claim 10, wherein the output feedback circuit includes:
a differential amplifier which generates a first voltage in accordance with the output current;
a D/A converter which changes a motor control signal inputted from a microcomputer located to the outside of the motor drive device into a second voltage; and
an error amplifier which amplifies a difference between a third voltage based on both the first voltage and the second voltage and the predetermined reference voltage to generate the feedback voltage.

12. The motor drive device according to claim 11, further comprising:
a serial interface which performs serial communication with the microcomputer, wherein
the motor control signal is inputted via the serial interface.

13. The motor drive device according to claim 9, further comprising:
a spindle motor driver which drives a spindle motor.

14. A magnetic disk storage device comprising:
a platter;
a magnetic head which reads and writes data to and from the platter;
a swing arm which holds the magnetic head at a tip end thereof;
a spindle motor which rotates the platter;
a voice coil motor which moves the swing arm in an arc; and
a motor drive device which drives the spindle motor and the voice coil motor, wherein
the motor drive device comprising:
a spindle motor driver which drives the spindle motor, and
a voice coil motor driver which drives the voice coil motor, wherein
the voice coil motor driver includes each of the class-AB amplifier as a pair of driver circuits for generating output currents to the voice coil motor, and wherein
the class-AB amplifier comprising:
an upper side transistor which is connected between an application terminal of a first power supply voltage and an application terminal of an output voltage;
a lower side transistor which is connected between an application terminal of a second power supply voltage and the application terminal of the output voltage;
a linear driver which generates an upper side gate voltage and a lower side gate voltage varying continuously with reverse polarity in accordance with an input voltage and a reference voltage to output the upper side gate voltage and the lower side gate voltage to the upper side transistor and the lower side transistor;
an upper side idler which biases the upper side gate voltage by applying an upper side bias current between an application terminal of the upper side gate voltage and the application terminal of the output voltage so as to turn on the upper side transistor in a crossover region between the input voltage and the reference voltage;

a lower side idler which biases the lower side gate voltage by applying a lower side bias current between an application terminal of the lower side gate voltage and the application terminal of the second power supply voltage so as to turn on the lower side transistor in the crossover region;

an upper side detection current generator which generates an upper side detection current in accordance with the upper side bias current;

a lower side detection current generator which generates a lower side detection current in accordance with the lower side bias current; and an off driver which controls the lower side gate voltage so as to reduce a degree of conduction of the lower side transistor as the upper side detection current is larger, and controls the upper side gate voltage so as to reduce a degree of conduction of the upper side transistor as the lower side detection current is larger.

15. An electronic appliance comprising:

the magnetic disk storage device, wherein the magnetic disk storage device comprising:

a platter;

a magnetic head which reads and writes data to and from the platter;

a swing arm which holds the magnetic head at a tip end thereof;

a spindle motor which rotates the platter;

a voice coil motor which moves the swing arm in an arc; and a motor drive device which drives the spindle motor and the voice coil motor, wherein the motor drive device comprising:

a spindle motor driver which drives the spindle motor, and a voice coil motor driver which drives the voice coil motor, wherein the voice coil motor driver includes each of the class-AB amplifier as a pair of driver circuits for generating output currents to the voice coil motor, and wherein the class-AB amplifier comprising:

an upper side transistor which is connected between an application terminal of a first power supply voltage and an application terminal of an output voltage;

a lower side transistor which is connected between an application terminal of a second power supply voltage and the application terminal of the output voltage;

a linear driver which generates an upper side gate voltage and a lower side gate voltage varying continuously with reverse polarity in accordance with an input voltage and a reference voltage to output the upper side gate voltage and the lower side gate voltage to the upper side transistor and the lower side transistor;

an upper side idler which biases the upper side gate voltage by applying an upper side bias current between an application terminal of the upper side gate voltage and the application terminal of the output voltage so as to turn on the upper side transistor in a crossover region between the input voltage and the reference voltage;

a lower side idler which biases the lower side gate voltage by applying a lower side bias current between an application terminal of the lower side gate voltage and the application terminal of the second power supply voltage so as to turn on the lower side transistor in the crossover region;

an upper side detection current generator which generates an upper side detection current in accordance with the upper side bias current;

a lower side detection current generator which generates a lower side detection current in accordance with the lower side bias current; and an off driver which controls the lower side gate voltage so as to reduce a degree of conduction of the lower side transistor as the upper side detection current is larger, and controls the upper side gate voltage so as to reduce a degree of conduction of the upper side transistor as the lower side detection current is larger.

* * * * *